United States Patent
Baba (10) Patent No.: US 10,749,236 B2
(45) Date of Patent: Aug. 18, 2020

(54) TRANSMISSION LINE

(71) Applicant: Murata Manufacturing Co., Ltd., Nagaokakyo-shi, Kyoto-fu (JP)

(72) Inventor: Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 24 days.

(21) Appl. No.: 16/175,885

(22) Filed: Oct. 31, 2018

(65) Prior Publication Data

US 2019/0067768 A1 Feb. 28, 2019

Related U.S. Application Data

(63) Continuation of application No. PCT/JP2018/000970, filed on Jan. 16, 2018.

(30) Foreign Application Priority Data

Jan. 19, 2017 (JP) .................................. 2017-007641

(51) Int. Cl.
*H01P 3/08* (2006.01)
*H05K 1/02* (2006.01)
(Continued)

(52) U.S. Cl.
CPC .............. *H01P 3/085* (2013.01); *H01P 1/02* (2013.01); *H01P 1/027* (2013.01); *H01P 3/08* (2013.01);
(Continued)

(58) Field of Classification Search
CPC .......... H01P 1/02; H01P 3/085; H01P 1/0245; H01P 1/027; H01P 3/08; H01P 11/003; H01P 3/088
(Continued)

(56) References Cited

U.S. PATENT DOCUMENTS

2001/0010271 A1* 8/2001 Lin ...................... H05K 1/0224
174/255
2005/0237137 A1* 10/2005 Dutta .................... H01P 1/2005
333/246
(Continued)

FOREIGN PATENT DOCUMENTS

JP 5690429 B1 3/2015
WO 2007/000933 A1 1/2007
(Continued)

OTHER PUBLICATIONS

Official Communication issued in International Patent Application No. PCT/JP2018/000970, dated Apr. 3, 2018.

*Primary Examiner* — Rakesh B Patel
*Assistant Examiner* — Jorge L Salazar, Jr.
(74) *Attorney, Agent, or Firm* — Keating & Bennett, LLP (57) ABSTRACT

A transmission line includes a laminated insulating body including insulating base material layers that are laminated, signal conductors provided inside the laminated insulating body and extending in a transmission direction along the insulating base material layer, and ground conductors sandwiching the signal conductors in a lamination direction via the insulating base material layers. The transmission line includes at least one curved portion that is bent along a plane orthogonal to the lamination direction. The signal conductors are separated from each other in a direction orthogonal to the transmission direction when viewed in the lamination direction and include a first signal conductor on an inner side and a second signal conductor on an outer side in the curved portion. An interval between the ground conductors sandwiching the first signal conductor is narrower than an interval between the ground conductors sandwiching the second signal conductor.

18 Claims, 4 Drawing Sheets

(51) Int. Cl.
*H01P 1/02* (2006.01)
*H01P 11/00* (2006.01)
(52) U.S. Cl.
CPC .......... *H01P 11/003* (2013.01); *H05K 1/0245* (2013.01); *H01P 3/088* (2013.01)
(58) Field of Classification Search
USPC .................................. 333/1, 5, 12, 238, 246
See application file for complete search history.

(56) References Cited

U.S. PATENT DOCUMENTS

2007/0063782 A1   3/2007  Kanno et al.
2015/0318595 A1   11/2015 Yosui et al.
2015/0340751 A1   11/2015 Watanabe et al.
2016/0270211 A1   9/2016  Yosui

FOREIGN PATENT DOCUMENTS

WO   2014/115607 A1   7/2014
WO   2015/186468 A1   12/2015

* cited by examiner

TRANSMISSION LINE

CROSS REFERENCE TO RELATED APPLICATIONS

This application claims the benefit of priority to Japanese Patent Application No. 2017-007641 filed on Jan. 19, 2017 and is a Continuation Application of PCT Application No. PCT/JP2018/000970 filed on Jan. 16, 2018. The entire contents of each application are hereby incorporated herein by reference.

BACKGROUND OF THE INVENTION

1. Field of the Invention

The present disclosure relates to a transmission line.

2. Description of the Related Art

A flat cable having multiple signal lines arranged in a width direction is attracting attention as a transmission line transmitting a high frequency signal in an electronic device. For example, WO 2014/115607 describes a transmission line including a flat dielectric element body, a signal conductor built into the dielectric element body and extending along a transmission direction, a reference ground conductor, an auxiliary ground conductor, and a thickness-direction connecting conductor, and it is described that the transmission line enables transmission with high isolation ensured between multiple high frequency signals and can be formed compact and thin.

SUMMARY OF THE INVENTION

Preferred embodiments of the present disclosure provide transmission lines each including a curved portion in which a transmission loss in a signal line on an inner side of the curved portion is reduced or prevented.

A transmission line according to a preferred embodiment of the present invention includes a laminated insulating body including a plurality of insulating base material layers that are laminated to one another, a plurality of signal conductors disposed inside the laminated insulating body to extend in a transmission direction along the insulating base material layer, and a plurality of ground conductors sandwiching the signal conductors in a lamination direction via the insulating base material layers. The transmission line includes at least one curved portion that is bent along a plane orthogonal or substantially orthogonal to the lamination direction. The signal conductors are separated from each other in a direction orthogonal or substantially orthogonal to the transmission direction when viewed in the lamination direction and include a first signal conductor on the inner side and a second signal conductor on the outer side in the curved portion. An interval between the ground conductors sandwiching the first signal conductor is narrower than an interval between the ground conductors sandwiching the second signal conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A transmission line having a curved portion is required due to downsizing of electronic devices in which the transmission line is used. Particularly in a transmission line including a curved portion with a small curvature radius, an electromagnetic field generated from a signal line arranged on the inner side of the curved portion is electromagnetically coupled at different positions on the same signal line in the curved portion and causes a characteristic deterioration, such as a transmission loss in some cases.

Preferred embodiments of the present invention provide transmission lines each including a curved portion in which a transmission loss in a signal line arranged on an inner side of the curved portion is reduced or prevented.

A transmission line according to a preferred embodiment includes a laminated insulating body including a plurality of insulating base material layers that are laminated to each other, a plurality of signal conductors extending in a transmission direction along the insulating base material layer, and a plurality of ground conductors sandwiching the signal conductors from the lamination direction via the insulating base material layers. The transmission line includes at least one curved portion that is bent along a plane orthogonal or substantially orthogonal to the lamination direction. The plurality of signal conductors are separated from each other in a width direction of the transmission line orthogonal or substantially orthogonal to the transmission direction when viewed in the lamination direction. The plurality of signal conductors include a first signal conductor disposed on the inner side and a second signal conductor disposed on the outer side in the curved portion. A minimum interval between the ground conductors sandwiching the first signal conductor is narrower than a minimum interval between the ground conductors sandwiching the second signal conductor.

The configuration described above reduces or prevents electromagnetic field coupling in a curved portion of the first signal conductor disposed on the inner side of the curved portion, so that a transmission loss is reduced or prevented.

The transmission line may preferably include a plurality of curved portions, and the first signal conductor is disposed on the inner side of the curved portion having the smallest radius of curvature. As a result, the transmission loss is reduced or prevented in the portion having the largest transmission loss, so that transmission characteristics are improved in the transmission line as a whole.

The transmission line may preferably further include at least one third signal conductor overlapping the first signal conductor in the lamination direction. The third signal conductor is separated from the first signal conductor in the lamination direction, and the ground conductor is disposed between the first signal conductor and the third signal conductor. The number of the third signal conductors may be greater than the number of the signal conductors overlapping with the second signal conductor in the lamination direction. As a result, the thickness of the transmission line is able to be reduced while suppressing the electromagnetic field coupling in the first signal conductor disposed on the inner side of the curved portion and the third signal conductor.

The transmission line may preferably include ground conductors sandwiching the third signal conductor. Furthermore, in the curved portion, an interval between the ground conductors sandwiching at least one of the third signal conductor may be narrower than an interval between the ground conductors sandwiching at least one of the second signal conductors. As a result, the electromagnetic field coupling between the signal conductors is more effectively reduced or prevented while more effectively reducing or preventing the electromagnetic field coupling in the signal conductor disposed on the inner side of the curved portion, so that crosstalk between the signal conductors is reduced or prevented.

The transmission line may preferably include the second signal conductor provided on the same insulating base material layer as the ground conductor sandwiching the first signal conductor. As a result, the electromagnetic field coupling is more effectively reduced or prevented between the first signal conductor and the second signal conductor, so that crosstalk between the signal conductors is reduced or prevented. Furthermore, the number of the laminated insulating base layers provided with the signal conductors defining the transmission line is able to be reduced, so that the manufacturing process is simplified.

Preferred embodiments of the present invention will now be described with reference to the drawings. It is noted that the preferred embodiments described below are examples of a transmission line for describing the technical ideas of the present invention, and the present invention is not limited to preferred embodiments of the transmission lines described below. The elements described in the claims are not limited to the elements of the preferred embodiments in any way. Particularly, the dimensions, materials, shapes, relative arrangements, and other parameters of the elements and components described in the preferred embodiments are merely illustrative examples and are not intended to limit the scope of the present invention thereto unless otherwise specified. In the drawings, the same elements and portions are denoted by the same reference numerals. Although the preferred embodiments are separately described for convenience and to facilitate explanation and/or understanding of the main points, configurations described in different preferred embodiments may be partially replaced or combined. In second and subsequent preferred embodiments, matters common to the first preferred embodiment will not be described, and only the differences will be described. Particularly, the same advantageous effects obtained by the same or similar structure or configuration will not be described in each preferred embodiment.

First Preferred Embodiment

Figure 1:
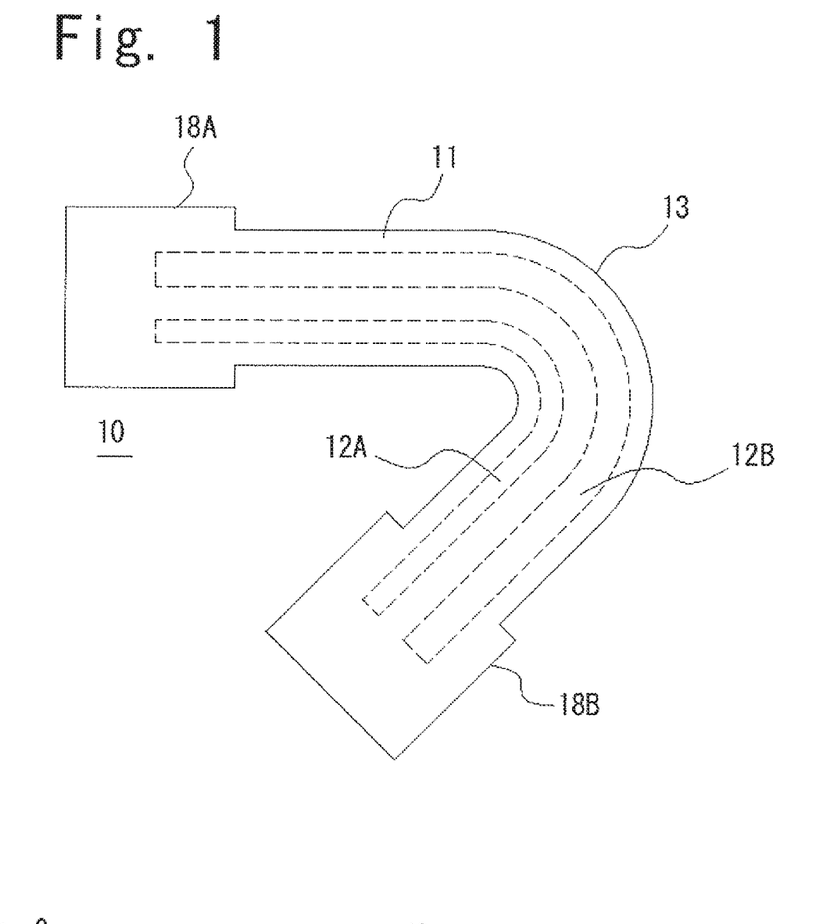
FIG. 1 is an example of a schematic transparent plane view of a transmission line according to a preferred embodiment of the present invention as viewed in a lamination direction.

FIG. 1 is an example of a transparent plane view of a transmission line 10 according to a first preferred embodiment of the present invention as viewed in a lamination direction of insulating base material layers. In FIG. 1, for simplicity, ground conductors are not shown. The transmission line 10 includes a curved portion 13 including a transmission direction that is bent along a plane orthogonal or substantially orthogonal to the lamination direction of the insulating base material layers. The transmission line 10 includes a first connection end portion 18A and a second connection end portion 18B connected to a substrate. The transmission line 10 enables transmission of a signal between the first connection end portion 18A and the second connection end portion 18B through each of a first signal conductor 12A and a second signal conductor 12B. For example, connectors corresponding to the first signal conductor 12A and the second signal conductor 12B are disposed on the first connection end portion 18A and the second connection end portion 18B and both connected to the substrate.

The first signal conductor 12A and the second signal conductor 12B are provided inside a laminated insulating body 11 including a plurality of insulating base material layers that are laminated, and each extends along the transmission direction. The first signal conductor 12A and the second signal conductor 12B are separated from each other in the width direction of the transmission line 10 orthogonal or substantially orthogonal to the transmission direction, and the first signal conductor 12A is disposed inside the second signal conductor 12B in the curved portion 13. The transmission line 10 including the curved portion 13 causes portions of the first signal conductor 12A to be closer to each other before and after the curved portion 13, and therefore, a mutual interaction may occur between an electromagnetic field generated by the first signal conductor 12A from the first connection end portion 18A to the curved portion 13 and an electromagnetic field generated by the first signal conductor 12A from the curved portion 13 to the second connection end portion 18B in the vicinity of the curved portion 13. The transmission line 10 according to the present preferred embodiment has a narrowed distance between the ground conductors sandwiching the first signal conductor 12A arranged on the innermost side of the curved portion 13, which reduces or prevents a spread of the electromagnetic field produced from the signal transmitted through the first signal conductor 12, and therefore reduces or prevents an electromagnetic field coupling of the first signal conductor 12A possibly occurring in the curved portion 13. As a result, transmission characteristics are prevented from deteriorating in the curved portion 13.

In FIG. 1, the second signal conductor 12B is preferably wider than the first signal conductor 12A. As a result, even if the interval between the conductors and the ground conductors are different from one another, impedance is able to be easily matched. Although only two signal conductors are provided in FIG. 1, three or more signal conductors may be provided so as to be separated from each other in the width direction. In this case, the signal conductor provided at the innermost position in the curved portion 13 is defined as the first signal conductor 12A.

Figure 2:
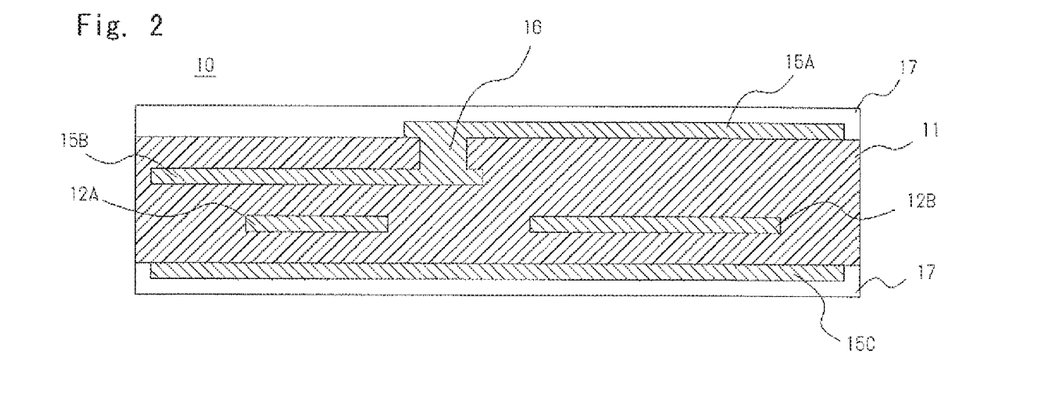
FIG. 2 is an example of a schematic cross-sectional view of the transmission line according to the preferred embodiment of the present invention shown in FIG. 1.

FIG. 2 is a cross-sectional view of the transmission line 10 according to the first preferred embodiment in a plane orthogonal or substantially orthogonal to the transmission direction. In FIG. 2, the first signal conductor 12A and the second signal conductor 12B are separated from each other in the width direction of the transmission line 10 inside the laminated insulating body 11. The first signal conductor 12A and the second signal conductor 12B are disposed at the same or substantially the same position in the lamination direction of the laminated insulating body 11. The first signal conductor 12A is disposed on the side that is the inner side of the curved portion.

The first signal conductor 12A is sandwiched between a ground conductor 15C and a ground conductor 15B via the insulating base material layers. The second signal conductor 12B is sandwiched between the ground conductor 15C and a ground conductor 15A via the insulating base material layers. The interval between the ground conductors 15C and 15B sandwiching the first signal conductor 12A is narrower than the interval between the ground conductors 15C and 15A sandwiching the second signal conductor 12B. The ground conductors 15A, 15B, and 15C are each provided along the transmission direction, so as to cover the first signal conductor 12A and the second signal conductor 12B when viewed in the lamination direction of the laminated insulating body. The ground conductor 15A and the ground conductor 15B are connected via an interlayer connection conductor 16 penetrating the insulating base material layer. The interlayer connection conductor 16 may partially be formed at least at one position between the ground conductors 15A and 15B and may be formed at multiple positions along the transmission direction of the ground conductors 15A and 15B. The ground conductors may be connected by a through-hole instead of the interlayer connection conductor 16. The ground conductor 15C is preferably not provided over the entirety of the transmission line 10 in the width direction, and a side surface of the ground conductor 15C is not exposed on a side surface of the transmission line 10. Additionally, in FIG. 2, protective layers 17 covering the ground conductors 15A and 15C are provided on both of the upper and lower surfaces of the transmission line 10. Although the ground conductors 15A and 15C are not connected in FIG. 2, the ground conductors may be connected via an interlayer connection conductor, a through-hole, or a conductor disposed outside the laminated insulating body 11.

In FIG. 2, the second signal conductor 12B is wider than the first signal conductor 12A. The transmission line 10 may be generally designed with a characteristic impedance of about 50Ω, for example. By making the line width of the second signal conductor 12B wider, the same or substantially the same characteristic impedance of about 50Ω is able to be achieved in both of a first transmission line portion including the first signal conductor 12A and the ground conductors 15C, 15B and a second transmission line portion including the second signal conductor 12B and the ground conductors 15C, 15A. A signal passing through the second signal conductor 12B having the larger line width is reduced in conductor loss as compared to a signal passing through the first signal conductor 12A. Therefore, for example, if a signal of about 600 MHz to about 900 MHz band or about 2 GHz band used for cellular phones may be assigned to the first transmission line portion, for example, a signal of about 5 GHz band used for WiFi may preferably be assigned to the second transmission line portion. In other words, it is preferable to assign a signal in a high frequency band, which is more significantly affected by transmission loss, to a transmission line portion including the signal conductor with a wider line width. Instead of making the line width of the signal conductor wider, the signal conductor may be made thicker to adjust the characteristic impedance. For example, the second signal conductor 12B may be thicker than the first signal conductor 12A to match the impedance. However, a process of manufacturing the transmission line 10 is simplified by making the second signal conductor 12B wider to match the impedance.

Figure 3:
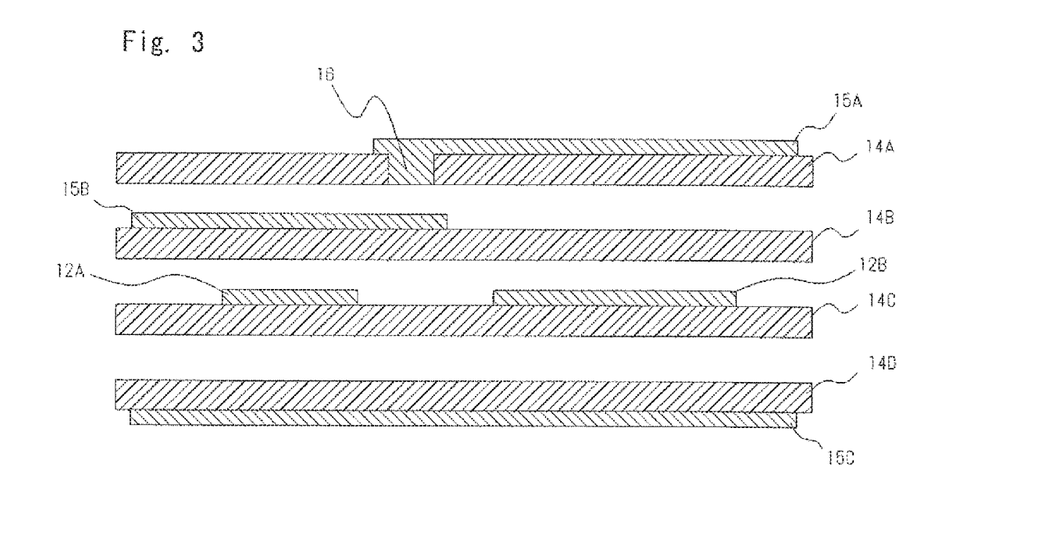
FIG. 3 is a schematic diagram for explaining a method of manufacturing the transmission line according to the preferred embodiment of the present invention shown in FIG. 1.
Figure 4:
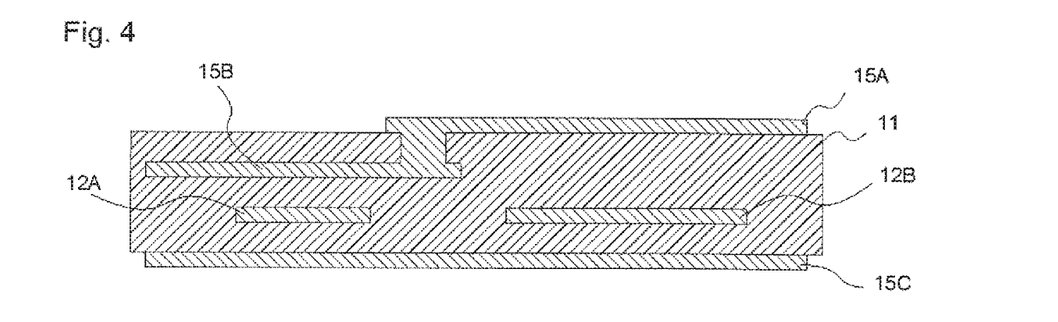
FIG. 4 is a schematic cross-sectional view for explaining the method of manufacturing the transmission line according to the preferred embodiment of the present invention shown in FIG. 1.

FIG. 3 is a schematic cross-sectional view of a non-limiting example of a method of forming the transmission line 10. As shown in FIG. 3, a plurality of ground conductors, a plurality of insulating base material layers, and a plurality of signal conductors are laminated and then heated and pressurized in a lamination direction using, for example, a heating press, to form an integrated transmission line. In FIG. 3, an insulating base material layer 14D includes the ground conductor 15C formed on a surface opposite to a surface facing an insulating base material layer 14C, the insulating base material layer 14C includes the first signal conductors 12A and the second signal conductor 12B formed on a surface facing an insulating base material layer 14B, the insulating base material layer 14B includes the ground conductor 15B formed on a surface opposite to a surface facing the insulating base material layer 14C, an insulating base material layer 14A includes the ground conductor 15A on a surface opposite to a surface facing the insulating base material layer 14B; and these layers are laminated in this order. The insulating base material layer 14A includes the interlayer connection conductor 16 connected to the ground conductor 15A, penetrating the insulating base material layer 14A, and exposed on the surface opposite to the surface disposed with the ground conductor 15A. Although not shown, by forming interlayer connection conductors also in the insulating base material layers 14B, 14C, and 14D in different cross sections to connect the ground conductor 15A, the ground conductor 15B, and the ground conductor 15C, the transmission line is able to be stably grounded as a whole. The insulating base material layers 14A to 14D may preferably be made of a thermoplastic resin, such as liquid crystal polymer (LCP), for example. The ground conductors 15A to 15C, the first signal conductor 12A, and the second signal conductor 12B may preferably be formed by, for example, patterning a copper foil into a desired shape on a single-sided copper-clad base material with the copper foil affixed to one entire surface of an insulating base material layer. The interlayer connection conductor 16 may be formed in the thickness direction of the insulating base material layer by, for example, forming a through-hole by a method, such as irradiation with a laser beam from the surface of the single-sided copper-clad base material not covered with the copper foil and filling the through-hole with a conductive paste. The insulating base material layers 14A to 14D provided with the ground conductors and the signal conductors in a desired shape may be heated and pressurized in the lamination direction by, for example, a heating press, to obtain a laminated insulating body integrated with the conductors as shown in FIG. 4. The protective layers 17 as shown in FIG. 2 may be formed on both of the upper and lower surfaces of the obtained laminated insulating body to form the transmission line 10.

The first signal conductor 12A and the second signal conductor 12B provided on the insulating base material layer 14C in FIG. 3 may be disposed on the surface without the ground conductor on the insulating base material layer 14B or 14D including the ground conductor. In this case, the ground conductor and the signal conductors may be patterned and formed into desired shapes using a double-sided copper-clad base material, instead of the single-sided copper clad base material.

Second Preferred Embodiment

Figure 5:
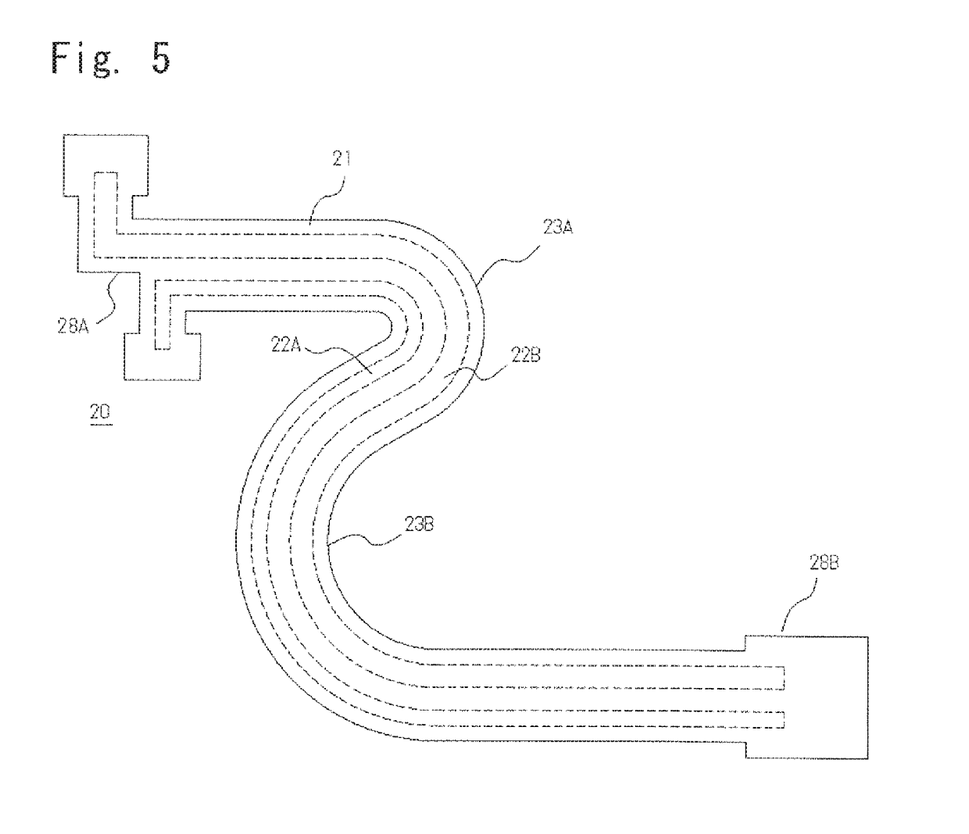
FIG. 5 is another example of a schematic transparent plane view of a transmission line according to a preferred embodiment of the present invention as viewed in the lamination direction.

FIG. 5 is an example of a transparent plane view of a transmission line 20 according to a second preferred embodiment of the present invention as viewed in the lamination direction of insulating base material layers. The transmission line 20 of the second preferred embodiment may have the same or similar configuration as the transmission line 10 of the first preferred embodiment, except that a first curved portion 23A and a second curved portion 23B are included as two curved portions having different radii of curvature.

In FIG. 5, for simplicity, ground conductors are not shown. The transmission line 20 includes the first curved portion 23A and the second curved portion 23B having a transmission direction that is bent along a plane orthogonal or substantially orthogonal to the lamination direction of the insulating base material layers and includes a first connection end portion 28A and a second connection end portion 28B connected to a substrate. The transmission line 20 enables transmission of a signal between the first connection end portion 28A and the second connection end portion 28B through each of a first signal conductor 22A and a second signal conductor 22B.

In FIG. 5, the radius of curvature of the first curved portion 23A is smaller than the radius of curvature of the second curved portion 23B. The first signal conductor 22A is located on the innermost side of the first curved portion 23A having a smaller curvature radius. The interval between the ground conductors sandwiching the first signal conductor 22A is smaller than the interval between the ground conductors sandwiching the second signal conductor 22B. A cross-sectional view of the transmission line 20 in a plane orthogonal or substantially orthogonal to the transmission direction is the same or substantially the same as FIG. 2. Although the two curved portions are provided in FIG. 5, three or more curved portions may be provided. In this case, the signal conductor disposed on the innermost side of the curved portion having the smallest curvature radius is defined as the first signal conductor 22A.

Third Preferred Embodiment

Figure 6:
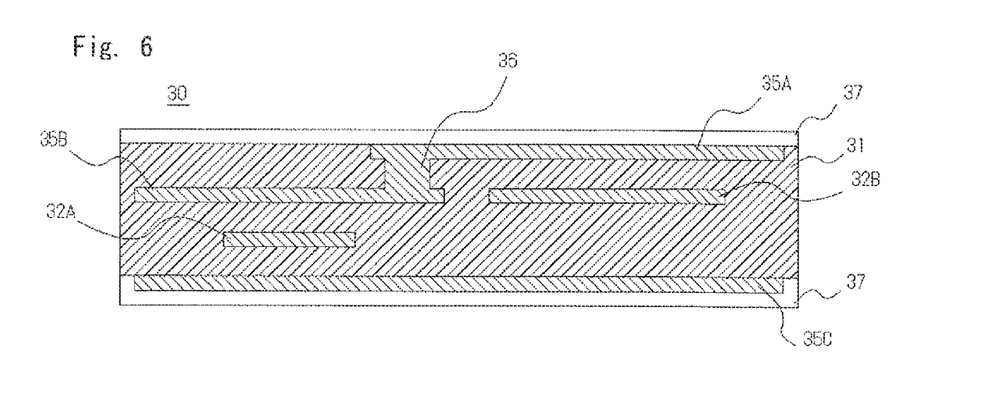
FIG. 6 is another example of a schematic cross-sectional view of a transmission line according to a preferred embodiment of the present invention.

FIG. 6 is a cross-sectional view of a transmission line according to a third preferred embodiment of the present invention in a plane orthogonal or substantially orthogonal to the transmission direction. The transmission line 30 of the third preferred embodiment may have the same or similar configuration as the transmission line 10 of the first preferred embodiment or the transmission line 20 of the second preferred embodiment, except that a second signal conductor 32B is provided on the same insulating base material layer as a ground conductor 35B sandwiching a first signal conductor 32A.

In FIG. 6, the first signal conductor 32A and the second signal conductor 32B are provided in the laminated insulating body 31 and are spaced away from each other in the width direction of the transmission line 30 and in the thickness direction of the transmission line 30. The second signal conductor 32B is provided on the same insulating base material layer as the ground conductor 35B different from a ground conductor 35C sandwiching the second signal conductor 32B out of the ground conductors 35B and 35C sandwiching the first signal conductor 32A. Therefore, the second signal conductor 32B is provided at the same or substantially the same position as the ground conductor 35B in the lamination direction of the laminated insulating body 31. As a result, the electromagnetic field coupling between the first signal conductor 32A and the second signal conductor 32B is more effectively reduced or prevented, so that crosstalk between the signal conductors is reduced or prevented.

In the transmission line 30, the first signal conductor 32A is disposed on the innermost side of the curved portion and is sandwiched between the ground conductor 35C and the ground conductor 35B via the insulating base material. The second signal conductor 32B is sandwiched between the ground conductor 35C and a ground conductor 35A via the insulating base material layers. The interval between the ground conductors 35C and 35B sandwiching the first signal conductor 32A is narrower than the interval between the ground conductors 35C and 35A sandwiching the second signal conductor 32B. The ground conductors 35A, 35B, and 35C are provided along the transmission direction, each covering the first signal conductor 32A and the second signal conductor 32B in the thickness direction. The ground conductor 35A and the ground conductor 35B are connected via an interlayer connection conductor 36 penetrating the insulating base material layer. Additionally, in FIG. 6, protective layers 37 covering the ground conductors 35A and 35C are provided on both lamination surfaces of the transmission line. In FIG. 6, the interval between the second signal conductor 32B and the ground conductor 35A is different from the interval between the second signal conductor 32B and the ground conductor 35C. However, the intervals may be the same or substantially the same.

Fourth Preferred Embodiment

Figure 7:
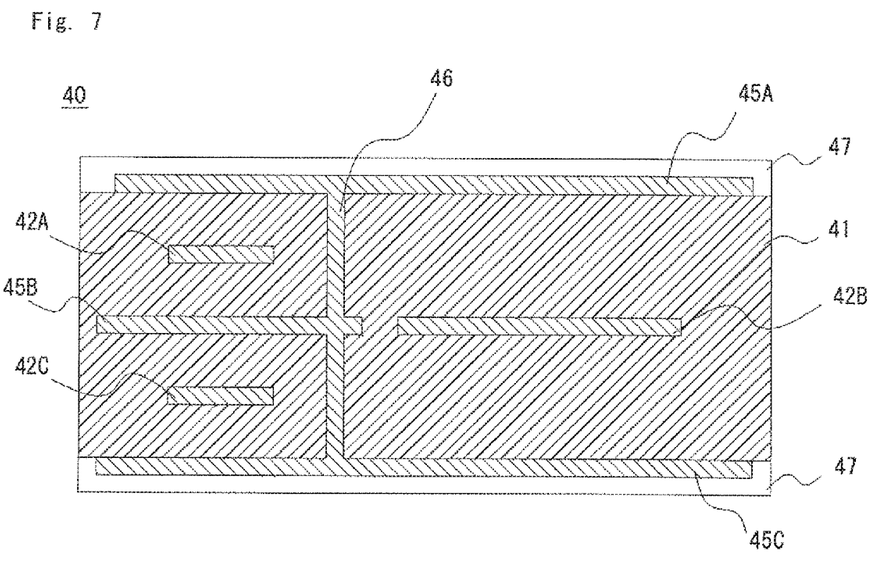
FIG. 7 is another example of a schematic cross-sectional view of a transmission line according to a preferred embodiment of the present invention.

FIG. 7 is a cross-sectional view of a transmission line according to a fourth preferred embodiment of the present invention in a plane orthogonal or substantially orthogonal to the transmission direction. The transmission line 40 of the fourth preferred embodiment may have the same or similar configuration as the transmission line 10 of the first preferred embodiment or the transmission line 20 of the second preferred embodiment, except that the transmission line includes a third signal conductor 42C overlapping with a first signal conductor 42A when viewed in the lamination direction and extending in the transmission direction with a ground conductor 45B disposed between the first signal conductor 42A and the signal conductors 42C, and that a ground conductor 45A, the ground conductor 45B, and the ground conductor 45C are connected by an interlayer connection conductor 46.

The transmission line 40 includes the third signal conductor 42C in addition to the first signal conductor 42A in an overlapping manner in the lamination direction of the laminated insulating body on the side located on the inner side of the curved portion having the smallest radius of curvature and includes the ground conductor 45B disposed between the first signal conductor 42A and the third signal conductor 42C. A second signal conductor 42B is separated from the first signal conductor 42A in the width direction of the transmission line 40 such that the interval between the ground conductors 45A and 45B sandwiching the first signal conductor 42A is narrower than the interval between ground conductors 45A and 45C sandwiching the second signal conductor 42B. The interval between the ground conductors 45B and 45C sandwiching the third signal conductor 42C is narrower than the interval between the ground conductors 45A and 45C sandwiching the second signal conductor 42B. The second signal conductor 42B is separated from the first signal conductor 42A in the thickness direction of the transmission line 40 and may be provided on the same insulating base material layer as the ground conductor 45B.

The transmission line 40 includes the first signal conductor 42A sandwiched between the ground conductor 45A and the ground conductor 45B via the insulating base material layers. The second signal conductor 42B is sandwiched between the ground conductor 45C and the ground conductor 45A via the insulating base material layers. The third signal conductor 42C is sandwiched between the ground conductor 45B and the ground conductor 45C via the insulating base material layers. The interval between the ground conductors 45A and 45B sandwiching the first signal conductor 42A is narrower than the interval between the ground conductors 45C and 45A sandwiching the second signal conductor 42B. The ground conductors 45A, 45B, and 45C are provided along the transmission direction, each covering the first signal conductor 42A, the second signal conductor 42B, and the third signal conductor 42C in the thickness direction. The ground conductors 45A, 45B, and 45C may be connected via the interlayer connection conductor 46 penetrating the insulating base material layers. Additionally, in FIG. 7, protective layers 47 covering the ground conductors 45A and 45C may be provided on both lamination surfaces of the transmission line.

By providing more signal conductors on the side located on the inner side than the outer side of the curved portion and providing the ground conductor between the laminated signal conductors, the transmission line including more signal conductors is able to be provided such that the overall thickness is reduced while reducing or preventing the electromagnetic field coupling between the signal conductors to prevent deterioration of characteristics.

Although the first signal conductor 42A and the third signal conductor 42C preferably have the same or substantially the same width in FIG. 7, the signal conductors may have different widths. The first signal conductor 42A and the third signal conductor 42C may at least partially overlap with each other in the lamination direction of the laminated insulating body 41. The third signal conductor 42C may not be provided as the only third signal conductor and may be provided as one of a plurality of third signal conductors. In such a case, the signal conductor having a center line in the width direction located on the innermost side of the curved portion is defined as the first signal conductor 42A. The second signal conductor 42B may not be provided as the only second signal conductor and may be provided as one of a plurality of second signal conductors 42B that at least partially overlap each other in the lamination direction. If the plurality of second signal conductors 42B are provided, the number of the third signal conductors 42C to be provided is preferably equal to or greater than the number of the second signal conductors 42B to be provided. In FIG. 7, the interval between the ground conductors 45A and 45B sandwiching the first signal conductor 42A is preferably the same or substantially the same as the interval between the ground conductors 45B and 45C sandwiching the third signal conductor 42C. However, the intervals may be different. The second signal conductor 42B is provided on the same insulating base material layer as the ground conductor 45B, but may be provided on a different insulating base material layer.

Although the transmission line according to the present preferred embodiment is not particularly limited in terms of the application of the first and third signal conductors and the second signal conductor, for example, the second signal conductor may be wider than the first signal conductor and the third signal conductor and may be therefore suitable for signal transmission in which a lower loss is required, for example, signal transmission in a higher frequency band. On the other hand, the first signal conductor and the third signal conductor are sandwiched between the ground conductors at a narrower interval and may therefore be suitable for signal transmission in which more isolation is required, for example, signal transmission in a lower frequency band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
   a laminated insulating body including a plurality of insulating base material layers that are laminated;
   a plurality of signal conductors provided inside the laminated insulating body and extending in a transmission direction along the plurality of insulating base material layers; and
   a plurality of ground conductors sandwiching the plurality of signal conductors in a lamination direction via the plurality of insulating base material layers; wherein
   the transmission line includes at least one curved portion that is bent along a plane orthogonal or substantially orthogonal to the lamination direction;
   the plurality of signal conductors are separated from each other in a direction orthogonal or substantially orthogonal to the transmission direction when viewed in the lamination direction and include a first signal conductor disposed on an inner side and a second signal conductor disposed on an outer side in the at least one curved portion;
   the plurality of ground conductors include ground conductors sandwiching the first signal conductor, and ground conductors sandwiching the second signal conductor; and
   an interval between the ground conductors sandwiching the first signal conductor is narrower than an interval between the ground conductors sandwiching the second signal conductor.

2. The transmission line according to claim 1, wherein
   the at least one curved portion includes a plurality of curved portions; and
   the first signal conductor is disposed on the inner side in one of the plurality of curved portions having a smallest radius of curvature.

3. The transmission line according to claim 2, wherein
   the plurality of signal conductors include at least one third signal conductor overlapping with the first signal conductor when viewed in the lamination direction;
   the plurality of ground conductors include a further ground conductor provided between the first signal conductor and the at least one third signal conductor; and
   a number of the at least one third signal conductors is larger than a number of the plurality of signal conductors overlapping with the second signal conductor in the lamination direction.

4. The transmission line according to claim 3, wherein
the plurality of ground conductors include ground conductors including the further ground conductor sandwiching the at least one third signal conductor; and
an interval between the ground conductors sandwiching the at least one third signal conductor is smaller than an interval between the ground conductors sandwiching the second signal conductor.

5. The transmission line according to claim 4, wherein the second signal conductor is provided on a same insulating base material layer as one of the ground conductors sandwiching the first signal conductor.

6. The transmission line according to claim 3, wherein the second signal conductor is provided on a same insulating base material layer as one of the ground conductors sandwiching the first signal conductor.

7. The transmission line according to claim 2, wherein the second signal conductor is provided on a same insulating base material layer as one of the ground conductors sandwiching the first signal conductor.

8. The transmission line according to claim 1, wherein
the plurality of signal conductors include at least one third signal conductor overlapping with the first signal conductor when viewed in the lamination direction;
the plurality of ground conductors include a further ground conductor provided between the first signal conductor and the at least one third signal conductor; and
a number of the at least one third signal conductors is larger than a number of the plurality of signal conductors overlapping with the second signal conductor in the lamination direction.

9. The transmission line according to claim 8, wherein the second signal conductor is provided on a same insulating base material layer as one of the ground conductors sandwiching the first signal conductor.

10. The transmission line according to claim 8, wherein
the plurality of ground conductors include ground conductors including the further ground conductor sandwiching the at least one third signal conductor; and
an interval between the ground conductors sandwiching the at least one third signal conductor is smaller than an interval between the ground conductors sandwiching the second signal conductor.

11. The transmission line according to claim 10, wherein the second signal conductor is provided on a same insulating base material layer as one of the ground conductors sandwiching the first signal conductor.

12. The transmission line according to claim 1, wherein the second signal conductor is provided on a same insulating base material layer as one of the ground conductors sandwiching the first signal conductor.

13. The transmission line according to claim 1, wherein at least two of the plurality of ground conductors are connected to each other by an interlayer connection conductor.

14. The transmission line according to claim 1, further comprising protective layers provided on upper and lower surfaces of the transmission line and covering the plurality of ground conductors.

15. The transmission line according to claim 1, wherein the second signal conductor is wider than the first signal conductor.

16. The transmission line according to claim 1, wherein the second signal conductor is thicker than the first signal conductor.

17. The transmission line according to claim 1, wherein the plurality of insulating base material layers are made of a thermoplastic resin.

18. The transmission line according to claim 1, wherein the plurality of ground conductors and the plurality of signal conductors are made of a copper foil.

* * * * *